United States Patent [19]

Sukemura

[11] Patent Number: 4,857,834
[45] Date of Patent: Aug. 15, 1989

[54] SEMICONDUCTOR INTEGRATED CIRCUIT
[75] Inventor: Takao Sukemura, Kawasaki, Japan
[73] Assignee: Fujitsu Limited, Kawasaki, Japan
[21] Appl. No.: 97,891
[22] Filed: Sep. 17, 1987
[30] Foreign Application Priority Data Sep. 20, 1986 [JP] Japan .................. 61-222646

[51] Int. Cl.[4] .................................. G01R 31/28
[52] U.S. Cl. ......................... 324/73 R; 371/15; 371/20
[58] Field of Search .................. 324/73 R, 73 AT; 371/15, 16, 20

[56] References Cited

U.S. PATENT DOCUMENTS 4,272,721 6/1981 Beeman ........................ 324/73 R
4,417,151 11/1983 Klein et al. ..................... 324/73 R
4,441,183 4/1984 Dussault ........................ 324/73 R
4,583,223 4/1986 Inoue et al. .................... 324/73 R Primary Examiner—Ernest F. Karlsen

[57] ABSTRACT

A semiconductor integrated circuit comprises a digital circuit for performing a signal process and producing a digital signal, a digital/analog converter for converting the digital signal produced by said digital circuit into an analog signal, and logic means for extracting a predetermined number of bits from the digital signal upon a test mode. The semiconductor integrated circuit further comprises a switching circuit for selecting either one of the digital signal from said digital circuit and the analog signal from said digital/analog converter on the basis of a non-test mode or test mode, and for providing an external circuit with a selected signal, and a test controlling circuit for designating either one of said test and non-test modes and providing said logic means and switching circuit with a mode signal.

13 Claims, 5 Drawing Sheets

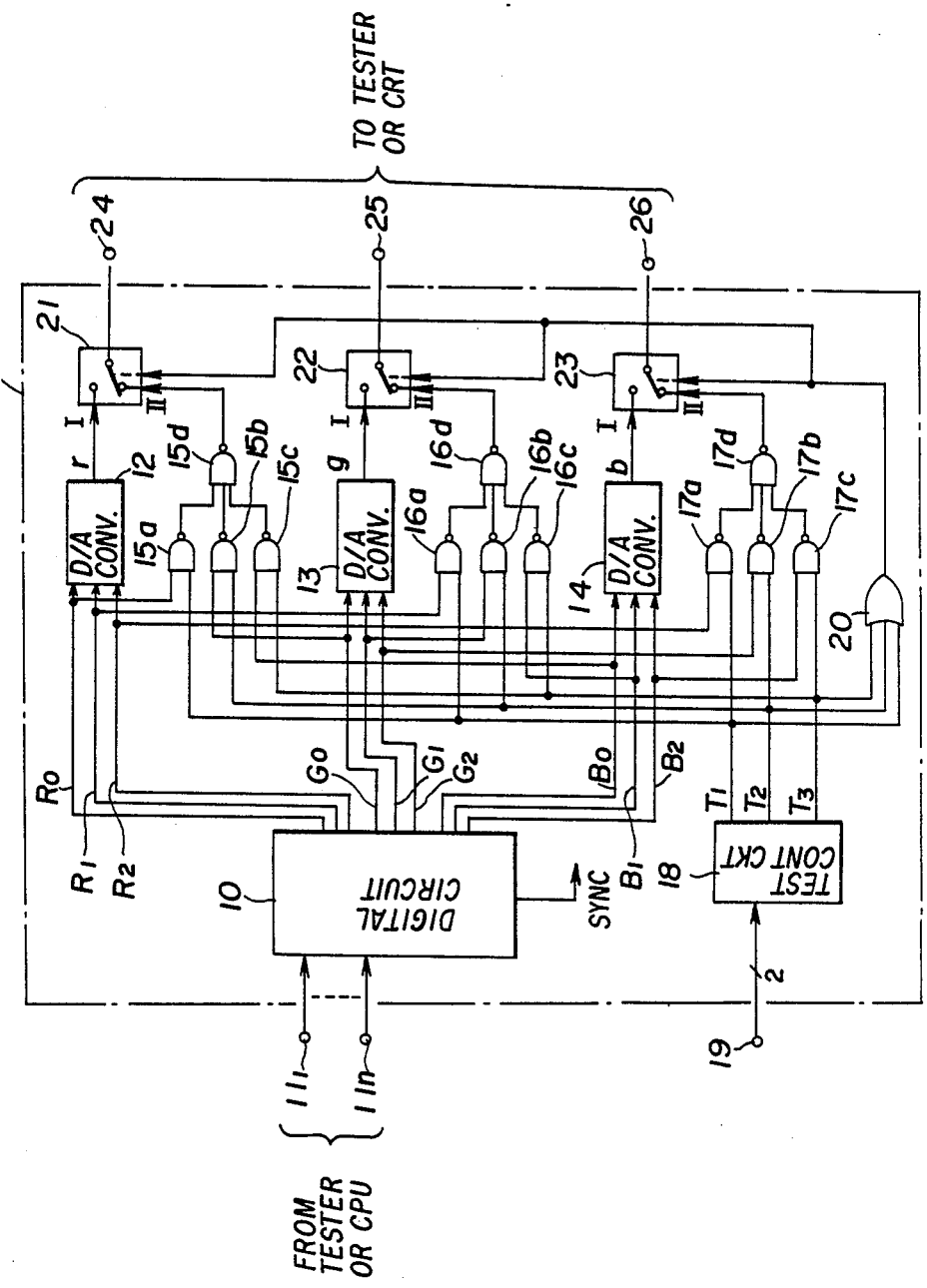

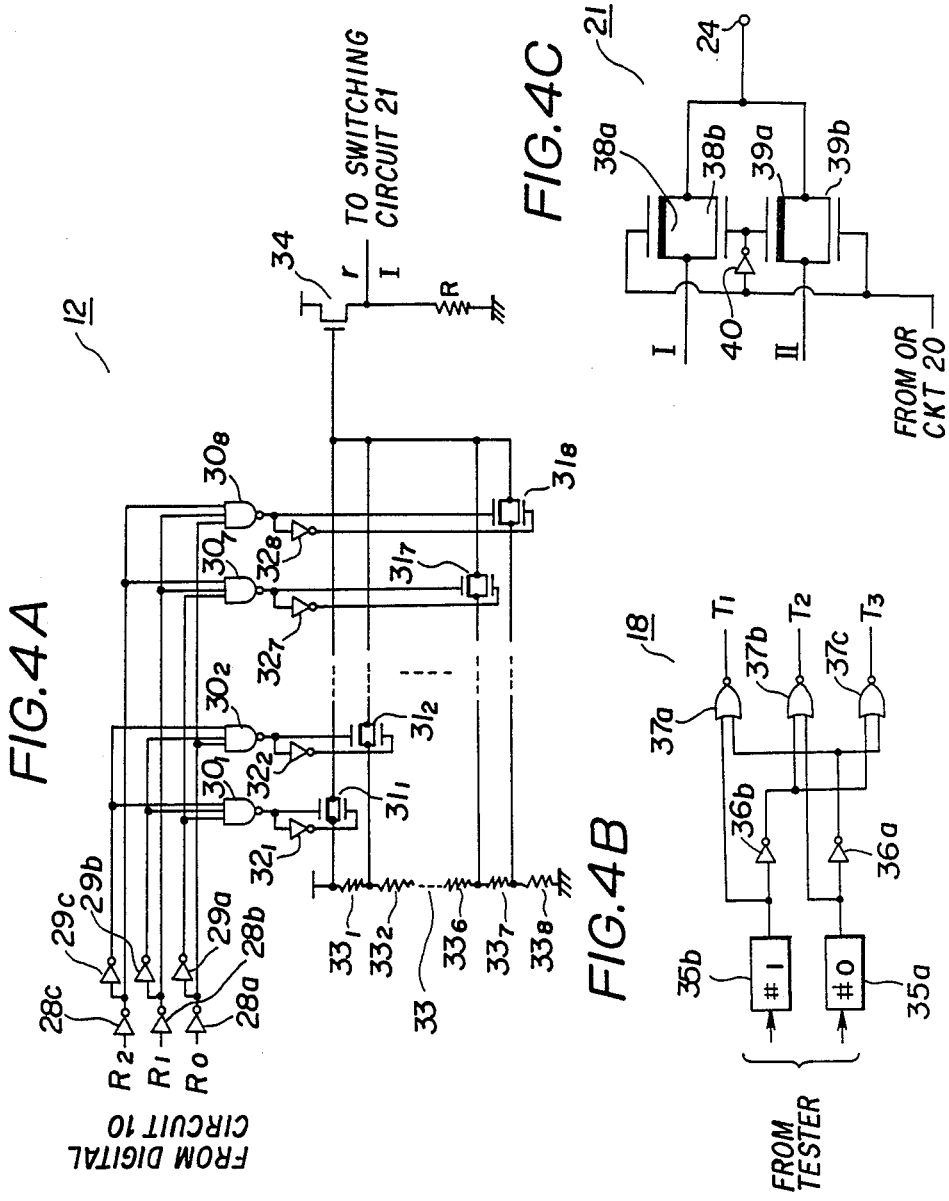

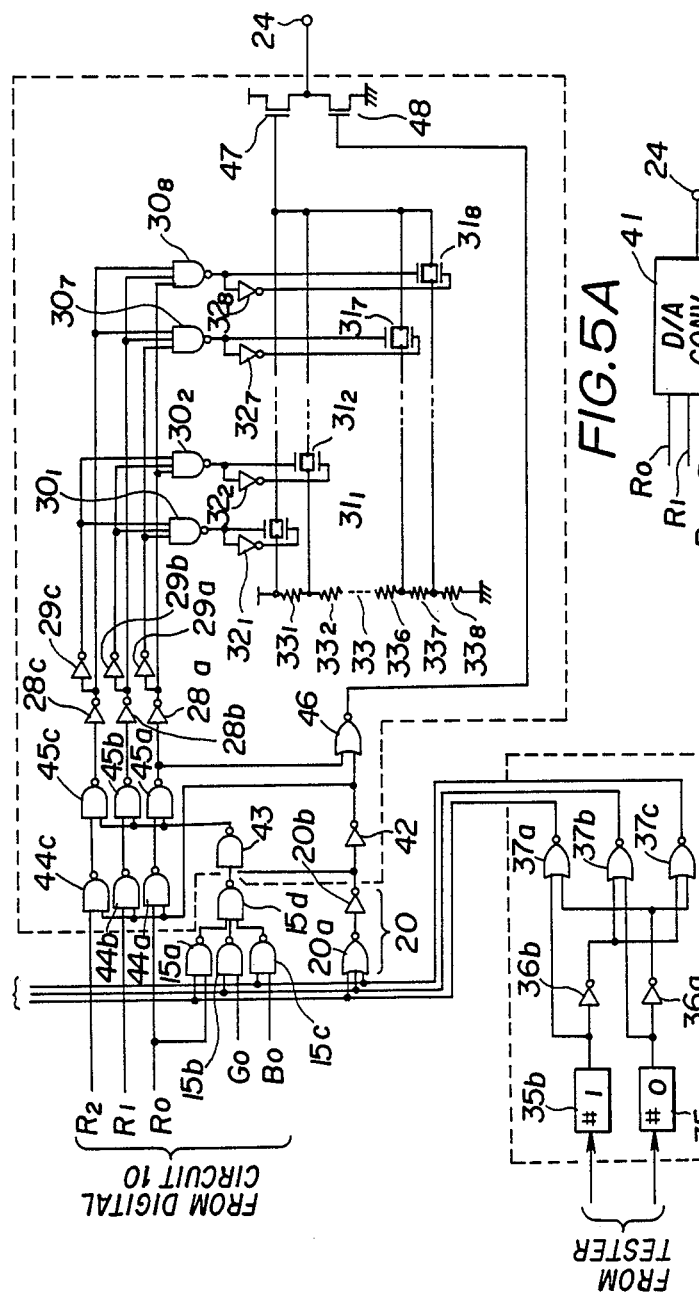
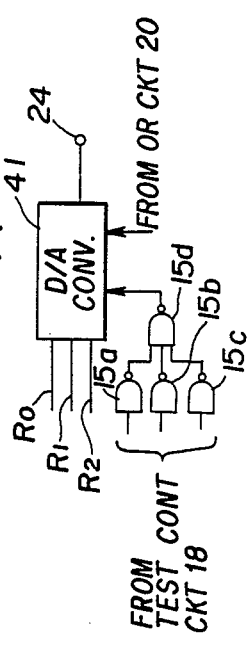
FIG.5A
FIG.5B

SEMICONDUCTOR INTEGRATED CIRCUIT

BACKGROUND OF THE INVENTION

The present invention generally relates to a semiconductor integrated circuit, and in particular to a semiconductor circuit which includes a digital circuit and a digital/analog converter and outputs an analog signal.

Conventionally, there is a semiconductor integrated circuit which includes a digital circuit and a digital/analog converter (hereafter referred to as D/A converter). A digital signal derived from the digital circuit is converted to an analog signal by the D/A converter. The converted analog signal is fed to an external circuit through output terminals. A cathode ray tube controller (hereafter referred to as CRTC) is an example of the above semiconductor integrated circuit.

Upon production, the semiconductor integrated circuit must be tested in order to investigate whether it can normally operate without an erroneous operation. The semiconductor integrated circuit is connected to a tester upon testing. The tester provides the semiconductor integrated circuit to be tested with test data and detects whether predetermined output data corresponding to the inputted test data are available at output terminals of the semiconductor integrated circuit. Such a test is called a function test.

However, the conventional semiconductor integrated circuit including the digital circuit and D/A converter has the following disadvantages. Since the semiconductor integrated circuit outputs the analog signal, the test for the built-in digital circuit must be performed on the basis of levels of the analog signal outputted by the semiconductor integrated circuit. This means that the number of levels of the analog signal increases with increasing the number of bits of the digital signal which is supplied to the D/A converter. For this reason, the level detection of the analog signal upon the function test for the digital circuit is very difficult when the number of bits of the digital data to be converted into the analog signal is large.

SUMMARY OF THE INVENTION

Accordingly, a general object of the present invention is to provide a novel and useful semiconductor integrated circuit, in which the above disadvantages have been eliminated.

A more specific object of the present invention is to provide a semiconductor integrated circuit, in which a function test for a built-in digital circuit can easily be performed.

Another object of the present invention is to provide a semiconductor integrated circuit, in which a function test for a built-in digital circuit can be easily performed even when the number of bits of digital data is relatively large.

To attain the above objects and features of the present invention, there is provided a semiconductor integrated circuit device comprising a digital circuit for performing a signal process and producing a digital signal, a digital/analog converter for converting the digital signal produced by the digital circuit into an analog signal, and logic means for extracting a predetermined number of bits from the digital signal upon a test mode. The semiconductor integrated circuit further comprises a switching circuit for selecting either one of the digital signal from said digital circuit or the analog signal from said digital/analog converter on the basis of a non-test mode or test mode, and for providing an external circuit with a selected signal, and a test controlling circuit for designating either one of said test and non-test modes and providing said logic means and switching circuit with a mode signal.

According to the present invention, there is another semiconductor integrated circuit comprising a digital circuit for performing a signal process and producing a digital signal, and logic means for successively extracting a predetermined number of bits from the digital signal upon a test mode. The semiconductor integrated circuit further comprises a digital/analog converter for converting the digital signal produced by said digital circuit into an analog signal upon a non-test mode and for passing said extracted bits from said logic means upon said test mode, and a test controlling circuit for designating either one of test and non-test modes and providing said digital/analog converter with a mode signal.

Other objects and features of the present invention will become apparent from the following detailed description in conjunction with the attached drawings.

BRIEF DESCRIPTION OF THE DRAWINGS

FIG. 1 is a circuit diagram of an example of a semiconductor integrated circuit according to the present invention;

FIG. 4A is a circuit diagram of a digital/analog converter shown in FIG. 1;

FIG. 4B is a circuit diagram of a test controlling circuit shown in FIG. 1;

FIG. 4C is a circuit diagram of a switching circuit shown in FIG.1;

FIG. 5A is a block diagram of an essential part of another example of a semiconductor integrated circuit according to the present invention;

FIG. 5B is a circuit diagram of the essential part shown in FIG. 5A; and

DETAILED DESCRIPTION

Figure 2:
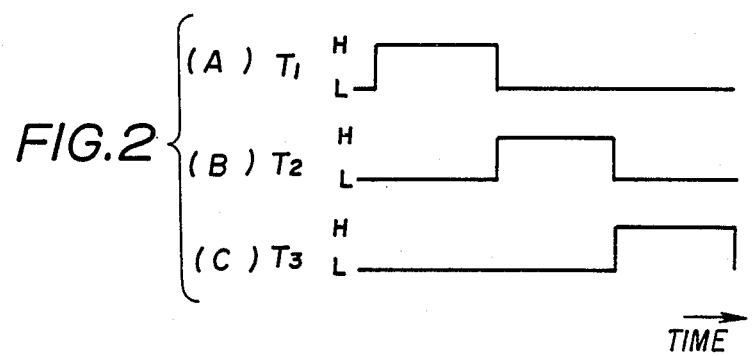
FIG. 2 is a view showing waveforms of output signals of a test controlling circuit shown in FIG. 1.

A description will first be given on an example of a semiconductor integrated circuit according to the present invention, by mainly referring to FIGS. 1 and 2.

FIG. 1 shows a circuit configuration of a semiconductor integrated circuit 100. The circuit 100 includes a digital circuit 10 and D/A converters 12, 13 and 14. The digital circuit 10 is, for example, a digital circuit for an image process which generally comprises registers, computing circuits, a color look-up table circuit and so on. In this example, an address signal, image data and a controlling signal are fed from a tester or a central processing unit (not shown; hereafter referred to as CPU) to the digital circuit 10 through some of the terminals $11_1$–$11_n$ thereof. The digital circuit 10 performs a signal process for the inputted image data, and converts the image data into primary color data signals of each of red, green and blue with reference to the color look-up table. In this example, each of the primary color data signals (codes) is composed of three bits.

A primary color data signal of red which is composed of three bits $R_0$, $R_1$ and $R_2$ is supplied from the digital circuit 10 to a D/A converter 12. Bits $R_0$, $R_1$ and $R_2$ are supplied to NAND circuits 15l, 16a and 17a, respectively. A primary color data signal of green made up of three bits $G_0$, $G_1$ and $G_2$ is fed from the digital circuit 10 to a D/A converter 13. Bits $G_0$, $G_1$ and $G_2$ are supplied to NAND circuits 15b, 16b and 17b, respectively. A primary color data signal of blue composed of three bits $B_0$, $B_1$ and $B_2$ is delivered from the digital circuit 10 to a D/A converter 14. Bits $B_0$, $B_1$ and $B_2$ are fed to NAND circuits 15c, 16c and 17c, respectively.

The D/A converters 12, 13 and 14 convert the corresponding primary color signals of the digital form into primary color signals r, g and b of the analog form. The analog primary color signals r, g and b are supplied to input terminals I of switching circuits 21, 22 and 23, respectively.

A test controlling circuit 18 which is a decoder produces test mode signals $T_1$, $T_2$ and T when indicated by a control signal of two bits provided by a tester or CPU through a terminal 19. The test mode signals $T_1$, $T_2$ and $T_3$ are a set of signals for designating either one set of the primary color data signals $R_0 14 R_2$, $G_0-G_2$ and $B_0-B_2$. The test mode dignals are illustrated in FIG. 2. As illustrated, when any one of the signals $T_1$, $T_2$ and $T_3$ is at a high level, the other signals are at a low level. The test mode signal $T_1$ is provided to the NAND circuits 15a, 16a and 17a as well as an OR circuit 20. The test mode signal $T_2$ is provided to the NAND circuits 15b, 16b and 17b as well as the OR circuit 20. The test mode signal $T_3$ is provided to the NAND circuits 15c, 16c and 17c as well as the OR circuit 20.

Outputs of the NAND circuits 15a, 15b and 15c are fed to an NAND circuit 15d, the output of which is sent to an input terminal II of the switching circuit 21. Similarly, outputs of the NAND circuits 16a, 16b and 16c are fed to an NAND circuit 16d, the output of which is sent to an input terminal II of the switching circuit 22. Further, outputs of the NAND circuits 17a, 17b and 17c are fed to an NAND circuit 17d, the output of which is sent to an input terminal II of the switching circuit 23. An output of the OR circuit 20 is fed, as a control signal, to each of the switching circuits 21, 22 and 23. As will be understood, the NAND circuits 15a, 15b, 15c, 15d, 16a, 16b, 16c, 16d, 17a, 17b, 17c and 17d constitute a distributer for distributing one digital code out of the three digital codes to corresponding output terminals.

Each of the switching circuits 21, 22 and 23 select signals applied to the terminals I when the control signal from the OR circuit 20 is at the low level, whereas selecting signals applied to the terminals II when the control signal is at the high level. The outputs of the switching circuits 21, 22 and 23 are outputted through an external circuit (not shown) such as a tester or a cathode ray tube (hereafter referred to as CRT) through terminals 24, 25 and 26, respectively.

The semiconductor integrated circuit 100 is packaged with plastic resin, for example, so that a semiconductor integrated circuit device is formed. Therefore, the terminals $11_1-11_n$, 19 and 24-26 are externally extended from the package.

Figure 3:
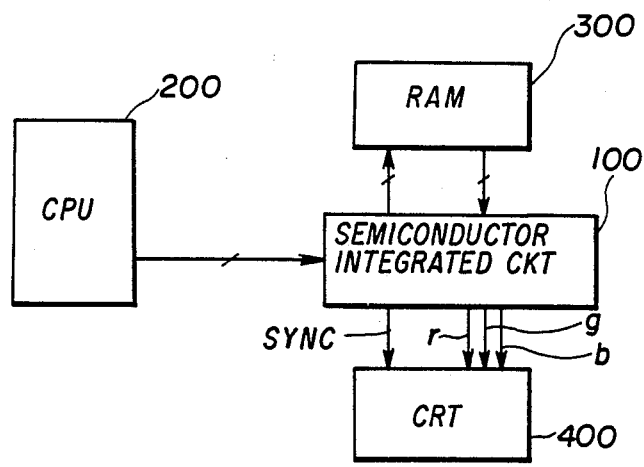
FIG. 3 is a block diagram of a display apparatus, in which an example of a semiconductor integrated circuit according to the present invention is used.

The semiconductor integrated circuit thus configured is used as shown in FIG. 3. In this figure, a CPU 200 provides the semiconductor integrated circuit 100 with the address signal, image data and control signal mentioned previously. The image data are sent to a random access memory 300 (hereafter referred to as RAM) and stored therein. At the time of the displaying operation, the digital circuit 10 built in the semiconductor integrated circuit 100 receives image data and addresses from the RAM and performs the signal process for the received image data and addresses, and feeds the primary color data signals R, G and B to the D/A converters 12, 13 and 14. Then, these converters feed the analog primary color signals r, g and b to a CRT 400. In addition, the digital circuit 10 provides a synchronization signal with the CRT 400.

At the time of the function test for the semiconductor integrated circuit 100, it is coupled to the tester. It is assumed that the test mode signals $T_1$, $T_2$ and $T_3$ having waveforms illustrated in FIG. 2 are produced by the test controlling circuit 18. While the test mode signal $T_1$ is at the high level and the other test mode signals $T_2$ and $T_3$ are at the low level, the NAND circuits 15a, 16a and 17a is kept active, and the red primary color data $R_0$, $R_1$ and $R_2$ are supplied to the terminals II of the switching circuits 21, 22 and 23 through the NAND circuits 15d, 16d and 17d, respectively. During this period, the switching circuits 21, 22 and 23 select the respective terminals II, because the output of the OR circuit 20 is at the high level. Therefore, the red primary color data $R_0$, $R_1$ and $R_2$ are applied to the output terminals 24, 25 and 26 through the switching circuits 21, 22 and 23, respectively. Likewise, while the test mode signal $T_2$ is at the high level and the other signals $T_1$ and $T_3$ are at the low level, the green primary color data $G_0$, $G_1$ and $G_2$ are fed to the terminals 24, 25 and 26 through the NAND circuits 15b, 16b and 17b and then through the NAND circuits 15d, 16d and 17d and further through the switching circuits 21, 22 and 23, respectively. Similarly, while the test mode signal $T_3$ is at the high level and the other signals are at the low level, the blue primary color data B, $B_1$ and $B_2$ are supplied to the terminals 24, 25 and 26.

When the test is terminated, all the test mode signals $T_1$, $T_2$ and $T_3$ are changed into the low level. Therefore, the analog primary color data signals r, g and b can be outputted to the terminals 24, 25 and 26 through the switching circuits 21, 22 and 23 in which the terminals I are selected, respectively.

As discussed in the foregoing, the analog primary color signals r, g and b are available at the terminals 24, 25 and 26 at the time of the non-test, whereas either one set of the digital primary color data $R_0-R_2$, $G_0-G_2$ and $B_0-B_2$ are available at the terminals 24, 25 and 26 at the time of the test. For this reason, the level detection of the analog primary color signals is unnecessary at the time of the test, and therefore the function test can easily be carried out even when the number of bits of the digital data to be converted into the analog form is considerably large.

FIG. 4A is a detailed circuit diagram of each of the D/A converters 12, 13 and 14. A configuration illustrted is a D/A converter with a ladder network. The digital data $R_0$, $R_1$ and $R_2$ are respectively converted into two bits by means of the combination of inverters 28a and 29a; 28b and 29b; and 28c and 29c. Eight NAND circuits $30_1$, $30_2$, ..., $30_7$ and $30_8$ each have three input terminals and receive three predetermined bits of the six expanded bits. The outputs of the NAND circuits $30_1$, $30_2$, ..., $30_7$ and $30_8$ are provided to corresponding transmission gates $31_1$, $31_2$, ..., $31_7$ and $31_8$. Each of the transmission gates $31_1-31_8$ is formed by a pair of of p- and n-channel (complementary) metala oxide semiconductors (hereafter referred to as MOSs).

Each of the output terminals of the NAND circuits $30_1$–$30_8$ is connected to the gate terminal of the p-channel transistor of the corresponding transistor pair. The outputs of the NAND circuits $30_1$–$30_8$ are inverted by inverters $32_1$–$32_8$ and fed to the gate terminals of the corresponding n-channel transistors. Input terminals of the transmission gates $31_1$–$31_8$ are connected to a ladder type resistor network 33 made up of eight series-connected resistors $33_1, 33_2, \ldots, 33_7$ and $33_8$. For example, the input terminal of the transmission gate $31_1$ is connected to the connection between a power source terminal and the resistor $33_1$. The input terminal of the transmission gate $31_2$ is connected to the connection between the resistors $33_1$ and $33_2$. Likewise, the input terminals of the other transmission gates are connected to corresponding connection between two adjacent resistors. The resistor $RE_8$ is an off-set resistor. All the output terminals of the transmission gates $31_1$–$31_8$ are commonly connected to a gate terminal of a n-channel MOS transistor 34. An output signal of the MOS transistor 34 is extracted from a source terminal thereof. That is, the MOS transistor 34 with its source connected to ground through a resistor R is used in the form of the source-follower. Therefore, the output level at the source terminal varies with the level at the gate terminal. Therefore, the D/A conversion can be achieved. The source terminal of the transistor 34 is connected to the input terminal I of the switching circuit 21. The other D/A converters 13 and 14 are similarly configured.

FIG. 4B is a circuit diagram of the test controlling circuit 18 shown in FIG. 1. At the time of the function test, the control signal is provided from the tester to the test controlling circuit 18. In this example, the control signal is made up of two bits, #0 and #1. Bits #0 and #1 are fed to registers 35a and 35b, respectively. Modes shown in TABLE I are determined by the combination of the bits #0 and #1.

TABLE I

| Bit #0 | Bit #1 | Mode |
| --- | --- | --- |
| 0 | 0 | Normal |
| 0 | 1 | R test |
| 1 | 0 | G test |
| 1 | 1 | B test |

The output signals of the registers 35a and 35b are logically processed by means of a logic circuit consisting of inverter circuits 36a and 36b and NOR circuits 37, 37b and 37c. The NOR circuits 37a, 37and 37c output the test mode signals $T_1$, $T_2$ and $T_3$, respectively. For example, when '0' (low level) and '1' (high level) are supplied to the registers 35a and 35b respectively, the test mode signals $T_1$, $T_2$ and $T_3$ of '1', '0' and '0' respectively are produced.

FIG. 4C is a circuit diagram of the switching circuit 21 shown in FIG. 1. The switching circuit 21 includes two pairs of p- and n-channel (complementary) MOS transistors 38a and 38b; 39a and 39b. Gate terminals of the transistors 38a and 39b are connected to the output terminal of the OR circuit 20. The output signal of the OR circuit 20 is inverted and fed to gate terminals of the transistors 38b and 39a. The pair of transistors 38a and 38b receive the analog primary color signal of red through the terminal I, whereas the other pair receives the output signal of the NAND circuit 15d through the terminal II. Output terminals of both of the transistor pairs are connected to the output terminal 24. When the output signal of the OR circuit 20 is kept high, the signal applied at the terminal II is delivered to the output terminal 24, whereas the signal applied at the terminal I is fed to the terminal 24 when the output signal of the OR circuit 20 remains low. Of course, the other switching circuits 22 and 23 can be configured in the same way.

FIG. 5A is a block diagram of an essential part of another example of the semiconductor integrated circuit, and FIG. 5B is a circuit diagram thereof. In FIGS. 5A and 5B, the same elements as those in the previous figures are denoted by the same references as those therein.

One of the essential features of the illustrated example is that a D/A converter 41 has a function of switching as provided by the switching circuit 21. That is, the D/A converter 41 merely passes the digital signal from the NAND circuit 15d at the time of the function test.

In FIG. 5B, when '0' (low level; hereafter low or low level is simply referred to as 'L') and '1' (high level; hereafter high or high level is simply referred to as 'H') is fed to the registers 36a and 36b, respectively to inspect the red primary color signal, the test controlling circuit 18 produces the test mode signals $T_1$, $T_2$ and $T_3$ of 'H', 'L' and 'L', respectively. In this case, the OR circuit 20 composed of a NOR circuit 20a and an inverter 20b outputs 'H' (high level). This output 'h' is fed to an inverter 42 and a NAND circuit 43. The test mode signals $T_1$, $T_2$ and $T_3$ are also provided to the NAND circuits 15a, 15b and 15c, respectively. Since only the mode signal $T_1$ is 'L', bit $R_0$ can pass through the NAND circuit 15a, whereas bits $G_0$ and $B_0$ cannot pass through the NAND circuits 15b and 15c, respectively. The NAND circuit 15d receives the bit $R_0$ from the NAND circuit 15a and 'h' from each of the NAND circuits 15d passes the bit $R_0$. As pointed out previously, 'H' is fed to the NAND circuit 43. Thus, the bit $R_0$ is passed through the NAND circuit 43 and supplied to NAND circuits 45a, 45b and 45c. The output of the inverter 42 is 'L', each of NAND circuits 44a, 44b and 44c outputs 'H'. Therefore, all the outputs of the NAND circuits 45a, 45b and 45c varies with the level of the bit $R_0$, and are either one of 'L' or 'H'. In this case, when all the outputs of the NAND circuits 45a, 45b and 45c are 'H', the output of only the NAND circuit $30_1$ is 'L' and therefore the transmission gate $31_1$ transfers the power source voltage to a gate terminal of a n-channel MOS transistor 47. Simultaneously, there is provided 'L' to a gate terminal of the n-channel MOS transistor 48, which is connected to the transistor 47 in series. Therefore, 'H' is supplied to the output terminal 24 through the transistor 47. On the other hand, when all the outputs of the NAND circuits 45a, 45b and 45c are 'L', the output of only the NAND circuit $30_8$ is 'L' and correspondingly the transmission gate $31_8$ transfers the off-set level to the gate terminal of the transistor 47. At the same time, the gate terminal of the transistor 48 is provided with 'H' through the NOR gate 46. Consequently, 'L' is fed to the output terminal 24 through the transistor 48.

On the other hand, when '0' and '0' are fed to the registers 35a and 35b so that the normal operation mode (non-test mode) is selected, each of the test mode signals $T_1$, $T_2$ and $T_3$ is 'L'. In this case, the output of the OR circuit 20 is '1' and the output of the inverter 42 is 'H'. Therefore, all the NAND circuits 44a, 44b and 44c become open. Further, the output of the NAND circuit 15d is 'L', the output of the NAND circuit 43 is 'H'. Hence, all the NAND circuits 45a, 45b and 45c also become open, and bits $R_0$, $R_1$ and $R_2$ are therefore supplied to inverters 28a, 28b and 28c. The transmission gates $31_1$-$31_8$ selectively become open or closed, and the corresponding voltage level is supplied to the gate terminal of the transistor 47. Since the transistor 47 is used in the form of source follower, the analog level corresponding to the gate level appears at the output terminal 24. During the D/A conversion, the gate terminal of the transistor 48 is kept 'H'. The other D/A converters may be configured in the same way.

Figure 6:
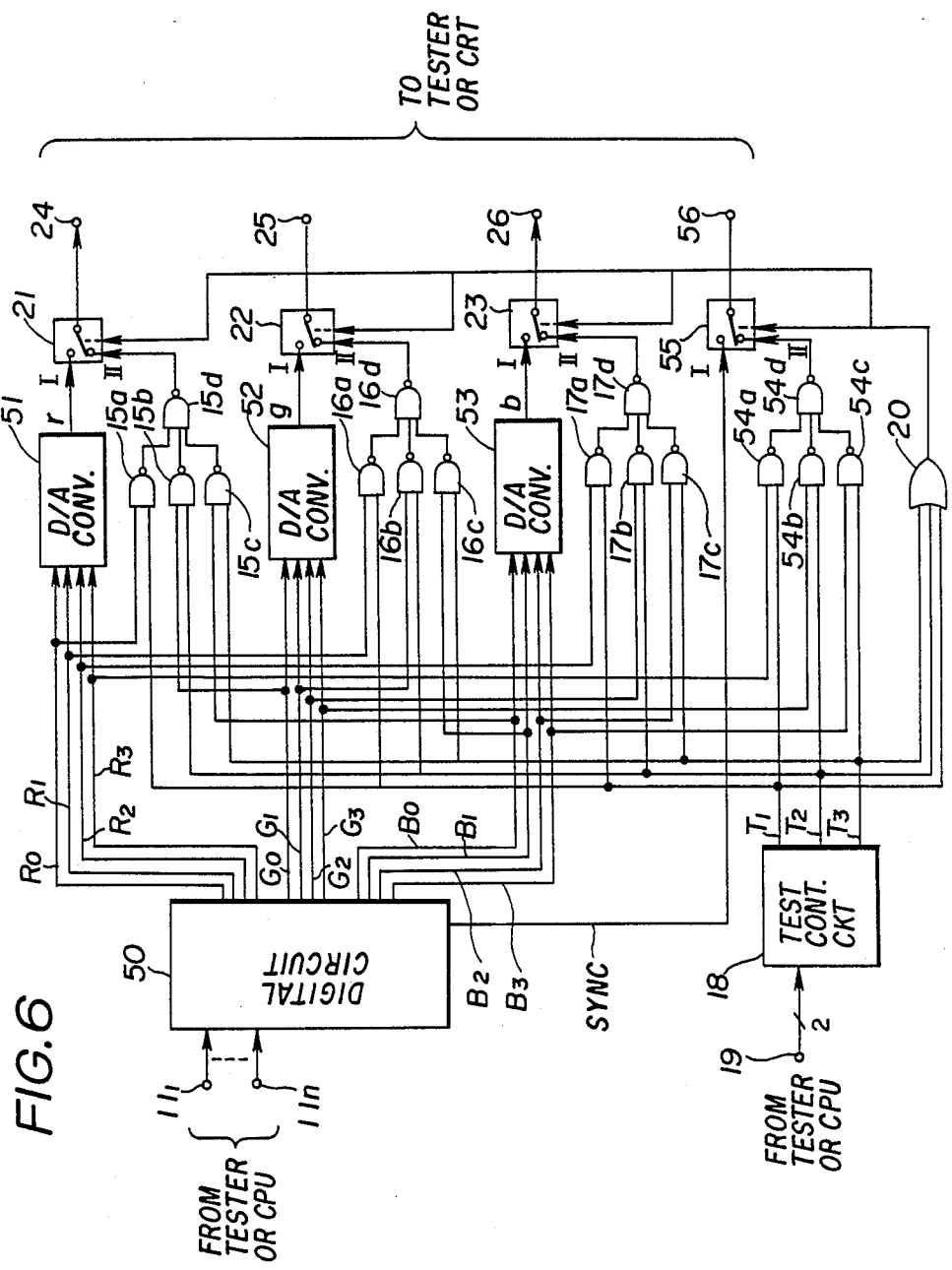
FIG. 6 is a circuit diagram of still another example of a semiconductor integrated circuit according to the present invention.

Still another example of the semiconductor integrated circuit according to the present invention is illustrated in FIG. 6. In this figure, the same elements as those in the previous figures are denoted by the same reference numerals as those therein.

A digital circuit 50 produces primary color signals of red, green and blue each made up of four bits. Data $R_0$, $R_1$, $R_2$ and $R_3$ of the red primary color signal are fed to a D/A converter 51. Likewise, data $G_0$, $G_1$, $G_2$ and $G_3$ of the green primary color signal are supplied to a D/A converter 52. Data $B_0$, $B_1$, $B_2$ and $B_3$ of the blue primary color signal are fed to a D/A converter 53. NAND circuits 54a, 54b and 54c receive bits $R_3$, $G_3$ and $B_3$, respectively. All the outputs of the NAND circuits 54a, 54b and 54c are delivered to a NAND circuit 54d, and output of which is supplied to an input terminal II of a switching circuit 55. An input terminal of the switching circuit 55 received a synchronization signal SYNC derived from the digital circuit 50 through another input terminal I. An output terminal of the switching circuit 55 is connected to an output terminal 56. The output terminal is originally designed to be a terminal for outputting the synchronization signal. According to the example in FIG. 6, in addition to outputting the synchronization signal, the terminal 56 is also used for outputting data $R_3$, $G_3$ or $B_3$. For this configuration, an additional terminal for outputting only these data is unnecessary. Of course, it is possible to use other signal output terminals such as a terminal for outputting a CRT control signal (not shown). Switching is controlled in accordance with the output of the OR circuit 20. Other elements are the same as those in FIG. 1.

Each of the D/A converters 51, 52 and 53 may be constituted in a similar way to that in FIG. 4A.

The present invention in not limited to the embodiments, but various variations and modifications may be made without departing from the scope of the present invention. For example, the present invention is applicable to processing of digital voice data. Also, the present invention is applicable to a semiconductor integrated circuit which handles digital data of more than four bits. Further, it is possible to selectively output a predetermined number of bits less than the total number of bits produced in the digital form.

What is claimed is:

1. A semiconductor integrated circuit comprising:
   digital signal producing means for producing a digital signal composed of a plurality of bits;
   digital-to-analog converting means for converting the digital signal produced by said digital signal producing means to an analog signal;
   logic means for selectively extracting a predetermined number of bits from the digital signal in accordance with a mode signal indicating a test mode or a non-test mode;
   switching means for selecting either one of an output signal of said logic means and said analog signal supplied from said digital-to-analog converting means, an output of the switching means being supplied to an external circuit; and
   test controlling means for controlling the switching means such that the analog signal is selected during said non-test mode and the extracted predetermined bits are selected during said test mode and for producing said mode signal provided to said logic means for indicating which bits are to be extracted from the digital signal in the logic means.

2. A semiconductor integrated circuit as claimed in claim 1, wherein said logic means comprises NAND circuits each of which received a corresponding bit included in the digital signal and the mode signal, and a NAND circuit for receiving all output signals of said NAND circuits and providing said switching means with a logic result.

3. A semiconductor integrated circuit as claimed in claim 1, wherein said switching means is formed by two transmission gates in parallel, each of which comprises complementary metal oxide semiconductor transistors, and wherein one of said transmission gates receives the digital signal from said logic means and the other receives the analog signal from the digital-to-analog converting means.

4. A semiconductor integrated circuit as claimed in claim 3, wherein said mode signal is applied to gate terminals of said transmission gates.

5. A semiconductor integrated circuit as claimed in claim 1, wherein said digital-to-analog converting means is configured by a digital/analog converter with a ladder network.

6. A semiconductor integrated circuit as claimed in claim 1, wherein said mode signal produced by said test controlling means comprises a plurality of bits, and wherein the logic means selectively extracts the predetermined number of bits contained in the digital signal in accordance with states of the plurality of bits which form the mode signal produced by the test controlling means.

7. A semiconductor integrated circuit as claimed in claim 6, wherein said plurality of bits which form said mode signal are all low levels during the non-test mode.

8. A semiconductor integrated circuit as claimed in claim 6, wherein the test controlling means further comprises an OR circuit which receives said plurality of bits which form said mode signal, and an output of the OR circuit is supplied to said switching means.

9. A semiconductor integrated circuit as claimed in claim 1, wherein said test controlling means is a decoder.

10. A semiconductor integrated circuit as claimed in claim 1, wherein said digital signal produced by said digital signal producing means is a digital image signal.

11. A semiconductor integrated circuit as claimed in claim 1, wherein said digital signal produced by said digital signal producing means is a digital voice signal.

12. A semiconductor integrated circuit as claimed in claim 1, wherein said semiconductor integrated circuit has another switching means for selecting one of the output signal of the logic means and a signal derived from said digital signal producing means which is to be directly supplied to said external circuit.

13. A semiconductor integrated circuit as claimed in claim 1, wherein said digital signal consists of a plurality of digital codes each consisting of the predetermined number of bits contained in the digital signal, and wherein the digital-to-analog converters which receive the corresponding digital codes, and wherein the logic means extracts all the bits contained in one of the digital codes which is selected in the mode signal, and wherein the switching means comprises switches, each of which receives one bit of each of the digital codes and the analog signal supplied from the corresponding digital-to-analog converter.

* * * * *